(12) United States Patent
Narita et al.

(10) Patent No.: US 7,986,046 B2
(45) Date of Patent: Jul. 26, 2011

(54) SEMICONDUCTOR MODULE AND METHOD OF PRODUCING THE SAME

(75) Inventors: Akihito Narita, Sakata (JP); Naoya Sato, Sakata (JP)

(73) Assignee: Seiko Epson Corporation (JP)

( * ) Notice: Subject to any disclaimer, the term of this patent is extended or adjusted under 35 U.S.C. 154(b) by 289 days.

(21) Appl. No.: 12/392,312

(22) Filed: Feb. 25, 2009

(65) Prior Publication Data

US 2009/0218685 A1 Sep. 3, 2009

(30) Foreign Application Priority Data

Mar. 3, 2008 (JP) ................................ 2008-051969

(51) Int. Cl.
*H01L 23/48* (2006.01)
*H01L 23/52* (2006.01)

(52) U.S. Cl. ........ 257/778; 257/773; 257/786; 257/737; 257/E23.078

(58) Field of Classification Search .................. 257/778, 257/737, 773, 786, E23.078
See application file for complete search history.

(56) References Cited

U.S. PATENT DOCUMENTS

| | | | |
|---|---|---|---|
| 6,449,838 B2* | 9/2002 | Murakami | 29/840 |
| 6,713,844 B2* | 3/2004 | Tatsuta et al. | 257/629 |
| 7,408,260 B2* | 8/2008 | Fjelstad et al. | 257/734 |
| 7,629,671 B2* | 12/2009 | Tanaka | 257/622 |
| 2002/0121706 A1* | 9/2002 | Tatsuta et al. | 257/778 |
| 2002/0195718 A1* | 12/2002 | Imasu et al. | 257/778 |
| 2003/0102570 A1* | 6/2003 | Imasu et al. | 257/778 |
| 2005/0127527 A1* | 6/2005 | Haimerl et al. | 257/778 |
| 2005/0269714 A1* | 12/2005 | Akram et al. | 257/778 |
| 2006/0091539 A1* | 5/2006 | Tanaka | 257/737 |
| 2007/0063345 A1 | 3/2007 | Hashimoto | |
| 2009/0050353 A1 | 2/2009 | Hashimoto | |

FOREIGN PATENT DOCUMENTS

| | | |
|---|---|---|
| JP | 3284916 | 3/2002 |
| JP | 2007-042867 | 2/2007 |
| JP | 2007-048812 | 2/2007 |
| JP | 2009-49225 | 3/2009 |

* cited by examiner

*Primary Examiner* — Nitin Parekh
(74) *Attorney, Agent, or Firm* — Harness, Dickey & Pierce, P.L.C.

(57) ABSTRACT

A semiconductor module including: a semiconductor chip in which an integrated circuit is formed; an electrode formed on the semiconductor chip and electrically connected to the integrated circuit; an insulating film formed on the semiconductor chip and having an opening positioned corresponding to the electrode; an elastic protrusion disposed on the insulating film, a surface of the elastic protrusion opposite to the insulating film being convexly curved; an interconnect extending from over the electrode to over the elastic protrusion; an elastic substrate on which a lead is formed, the lead being in contact with part of the interconnect positioned on the elastic protrusion; and an adhesive maintaining a space between a surface of the semiconductor chip on which the elastic protrusion is formed and a surface of the elastic substrate on which the lead is formed. The elastic substrate has a first depression formed by elastic deformation. The lead is in contact with the interconnect on a surface of the first depression.

3 Claims, 3 Drawing Sheets

US 7,986,046 B2

SEMICONDUCTOR MODULE AND METHOD OF PRODUCING THE SAME

Japanese Patent Application No. 2008-51969, filed on Mar. 3, 2008, is hereby incorporated by reference in its entirety.

BACKGROUND OF THE INVENTION

The present invention relates to a semiconductor module and a method of producing the same.

A COF mounting technology that mounts a semiconductor chip on a flexible substrate has been known (see Japanese Patent No. 3284916). When using the COF mounting technology, a small surface of a bump of the semiconductor chip must be electrically connected to a small surface of a lead of the flexible substrate. This makes it difficult to ensure reliability. JP-A-2007-42867 discloses forming a terminal on a resin protrusion.

SUMMARY

According to a first aspect of the invention, there is provided a semiconductor module comprising:

a semiconductor chip in which an integrated circuit is formed;

an electrode formed on the semiconductor chip and electrically connected to the integrated circuit;

an insulating film formed on the semiconductor chip and having an opening positioned corresponding to the electrode;

an elastic protrusion disposed on the insulating film, a surface of the elastic protrusion opposite to the insulating film being convexly curved;

an interconnect extending from over the electrode to over the elastic protrusion;

an elastic substrate on which a lead is formed, the lead being in contact with part of the interconnect positioned on the elastic protrusion; and an adhesive maintaining a space between a surface of the semiconductor chip on which the elastic protrusion is formed and a surface of the elastic substrate on which the lead is formed, the elastic substrate having a first depression that is formed by elastic deformation; and the lead being in contact with the interconnect on a surface of the first depression.

According to a second aspect of the invention, there is provided a method of producing a semiconductor module comprising:

(a) mounting a semiconductor device on an elastic substrate on which a lead is formed through an adhesive, the semiconductor device including a semiconductor chip in which an integrated circuit is formed, an electrode formed on the semiconductor chip and electrically connected to the integrated circuit, an insulating film formed on the semiconductor chip and having an opening positioned corresponding to the electrode, an elastic protrusion disposed on the insulating film, a surface of the elastic protrusion opposite to the insulating film being convexly curved, and an interconnect extending from over the electrode to over the elastic protrusion; and a pressing force being applied to the semiconductor device and the elastic substrate to press part of the interconnect positioned on the elastic protrusion against the lead, the pressing force causing the elastic substrate to undergo elastic deformation through the lead to form a first depression and causing the lead to extend on a surface of the first depression; and (b) curing the adhesive to maintain a space between the semiconductor chip and the elastic substrate.

DETAILED DESCRIPTION OF THE EMBODIMENT

Figure 1:
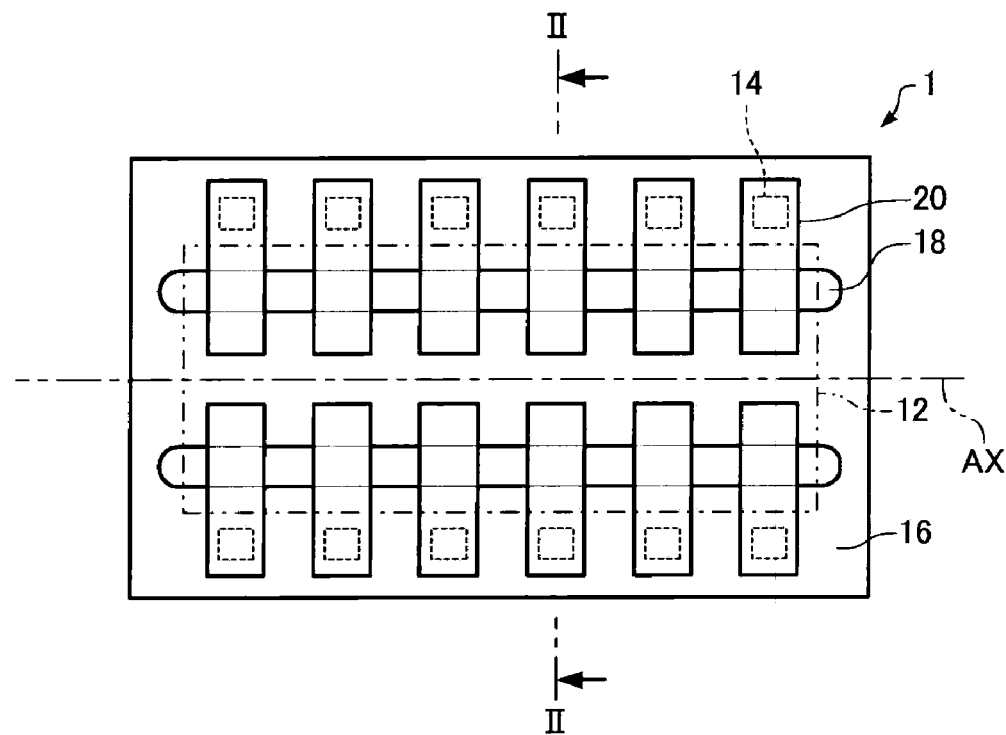
FIG. 1 is a plan view showing a semiconductor device used for a semiconductor module according to one embodiment of the invention.

The invention may improve electrical connection reliability.

(1) According to one embodiment of the invention, there is provided a semiconductor module comprising:

a semiconductor chip in which an integrated circuit is formed;

an electrode formed on the semiconductor chip and electrically connected to the integrated circuit;

an insulating film formed on the semiconductor chip and having an opening positioned corresponding to the electrode;

an elastic protrusion disposed on the insulating film, a surface of the elastic protrusion opposite to the insulating film being convexly curved;

an interconnect extending from over the electrode to over the elastic protrusion;

an elastic substrate on which a lead is formed, the lead being in contact with part of the interconnect positioned on the elastic protrusion; and an adhesive maintaining a space between a surface of the semiconductor chip on which the elastic protrusion is formed and a surface of the elastic substrate on which the lead is formed, the elastic substrate having a first depression that is formed by elastic deformation; and the lead being in contact with the interconnect on a surface of the first depression.

According to this embodiment, since the lead comes in contact with the interconnect on a surface of the first depression formed in the elastic substrate, the contact area of the lead with the interconnect increases as compared with the case where the lead comes in contact with the interconnect over a flat surface. This improves electrical connection reliability. Since the lead and the interconnect are caused to come in contact due to the elasticity of the elastic substrate and the elastic protrusion, electrical connection reliability is further improved.

(2) In this semiconductor module, the elastic protrusion may have a second depression that is formed by elastic deformation; and the interconnect may be in contact with the lead on a surface of the second depression.

(3) In this semiconductor module, the elastic protrusion may have a modulus of elasticity that is higher than a modulus of elasticity of the elastic substrate.

(4) According to one embodiment of the invention, there is provided a method of producing a semiconductor module comprising:

(a) mounting a semiconductor device on an elastic substrate on which a lead is formed through an adhesive, the semiconductor device including a semiconductor chip in which an integrated circuit is formed, an electrode formed on the semiconductor chip and electrically connected to the integrated circuit, an insulating film formed on the semiconductor chip and having an opening positioned corresponding to the electrode, an elastic protrusion disposed on the insulating film, a surface of the elastic protrusion opposite to the insulating film being convexly curved, and an interconnect extending from over the electrode to over the elastic protrusion; and a pressing force being applied to the semiconductor device and the elastic substrate to press part of the interconnect positioned on the elastic protrusion against the lead, the pressing force causing the elastic substrate to undergo elastic deformation through the lead to form a first depression and causing the lead to extend on a surface of the first depression; and (b) curing the adhesive to maintain a space between the semiconductor chip and the elastic substrate.

According to this embodiment, since the lead extends on a surface of the first depression, the contact area of the lead with the interconnect increases so that electrical connection reliability is improved. Since the surface of the elastic protrusion is convexly curved, the lead rarely breaks when causing the lead to extend on a surface of the first depression. Moreover, the elastic force of the elastic protrusion disperses stress to prevent breakage of the lead.

(5) In this method of producing a semiconductor module, the pressing force may cause the elastic protrusion to undergo elastic deformation through the interconnect to form a second depression.

Semiconductor Device

Figure 2:
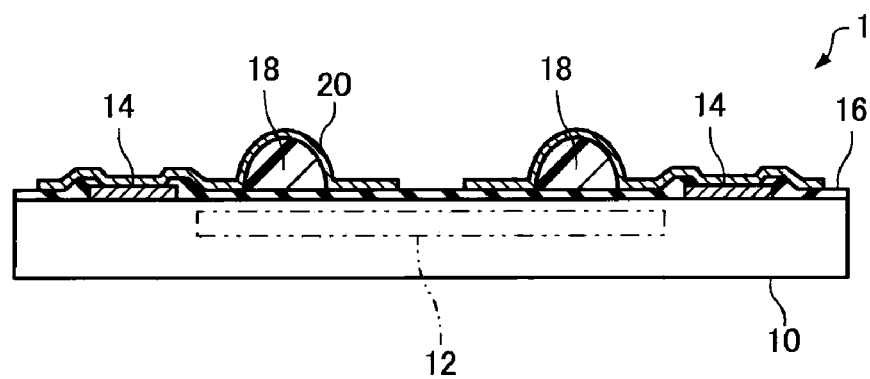
FIG. 2 is a cross-sectional view showing the semiconductor device shown in FIG. 1 taken along the line II-II.

FIG. 1 is a plan view showing a semiconductor device used for a semiconductor module according to one embodiment of the invention. FIG. 2 is a cross-sectional view showing the semiconductor device shown in FIG. 1 taken along the line II-II.

A semiconductor device 1 includes a semiconductor chip 10. The semiconductor chip 10 has a rectangular surface. An integrated circuit 12 (e.g., transistors) is formed in the semiconductor chip 10. A plurality of electrodes 14 are formed on the semiconductor chip 10 and are electrically connected to the integrated circuit 12. The electrodes 14 are arranged in one row or a plurality of rows (a plurality of parallel rows). The electrodes 14 are arranged (in parallel) along the side (e.g., long side) of the rectangular surface of the semiconductor chip 10. The electrodes 14 are electrically connected to the integrated circuit 12 through internal interconnects (not shown). An insulating film 16 (e.g., passivation film) that has openings positioned corresponding to the electrodes 14 is formed on the semiconductor chip 10 so that the electrodes 14 are at least partially exposed. The insulating film 16 may be formed only of an inorganic material (e.g., $SiO_2$ or SiN), for example. The insulating film 16 is formed over the integrated circuit 12.

Figure 3:
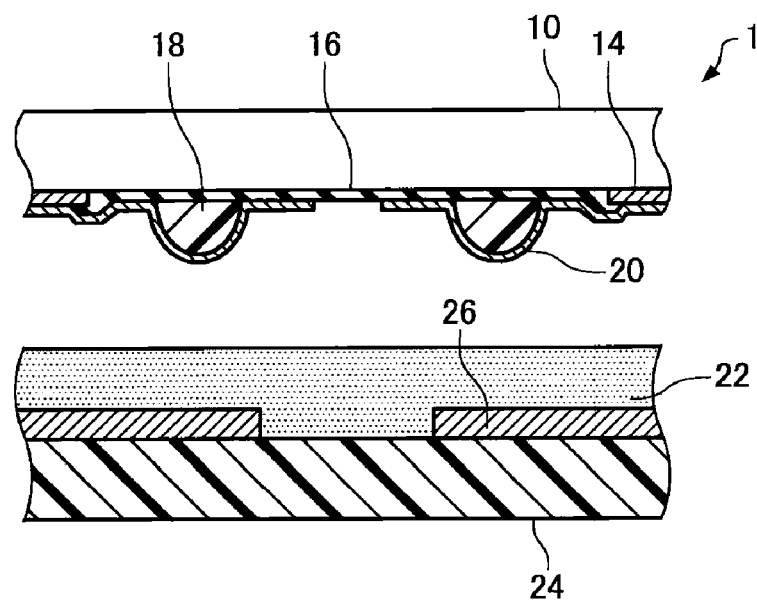
FIG. 3 illustrates a method of producing a semiconductor module according to one embodiment of the invention.

An elastic protrusion 18 is formed on the semiconductor chip 10 (insulating film 16). In FIGS. 1 to 3, the elastic protrusion 18 extends along the side (e.g., long side) of the rectangular surface of the semiconductor chip 10. A plurality of elastic protrusions 18 are arranged in parallel. The elastic protrusion 18 undergoes elastic deformation. As the material for the elastic protrusion 18, a polyimide resin, a silicone-modified polyimide resin, an epoxy resin, a silicone-modified epoxy resin, benzocyclobutene (BCB), polybenzoxazole (PBO), an acrylic resin, a silicone resin, a phenol resin, or the like may be used.

The elastic protrusion 18 is extended to be long. The cross section of the elastic protrusion 18 perpendicular to an axis AX that is parallel to an extending direction of the elastic protrusion has an arched shape having an arc and a chord, as shown in FIG. 2. A part of the elastic protrusion 18 corresponding to the chord is disposed on the insulating film 16, and a surface of the elastic protrusion 18 opposite to the semiconductor chip 10 is convexly curved. The curved surface of the elastic protrusion 18 is part of a surface of revolution that is drawn by rotating a straight line parallel to the longitudinal axis (rotation axis) of the elastic protrusion 18 around the rotation axis. The surface of the elastic protrusion 18 is a curved surface of a shape obtained by cutting a column along a plane in parallel with the center axis of the column. The elastic protrusion 18 widens toward the bottom so that the bottom surface is larger than the upper surface.

A plurality of interconnects 20 are formed on the semiconductor chip 10. As the material for the interconnects 20, Au, Ti, TiW, W, Cr, Ni, Al, Cu, Pd, lead-free solder, or the like may be used. Each of the interconnects 20 extends from over one of the electrodes 14 to over the elastic protrusion 18. The interconnects 20 are formed at intervals on the upper surface of the elastic protrusion 18. A plurality of interconnects 20 are formed on one elastic protrusion 18. The interconnects 20 extend to intersect the axis AX that is parallel to the extending direction of the elastic protrusion 18. Each of the interconnects 20 extends from over one of the electrodes 14, over the insulating film 16, and to over the elastic protrusion 18. The surface of the interconnects 20 are curved along the surface of the elastic protrusion 18. The interconnect 20 may be directly in contact with the electrode 14, or a conductive film (not shown) may be interposed between the interconnect 20 and the electrode 14. The interconnect 20 extends beyond the elastic protrusion 18 to the insulating film 16 on the side opposite to the electrode 14.

Method of Producing Semiconductor Module

Figure 4:
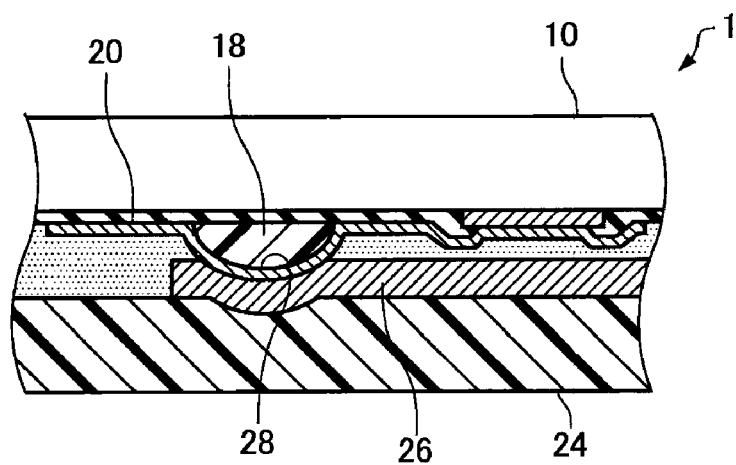
FIG. 4 illustrates a method of producing a semiconductor module according to one embodiment of the invention.

FIGS. 3 and 4 illustrate a method of producing a semiconductor module according to one embodiment of the invention.

In this embodiment, the above-described semiconductor device 1 is mounted on an elastic substrate 24 through an adhesive 22. The elastic substrate 24 undergoes elastic deformation, and may be a flexible substrate formed of a resin or the like. A lead 26 is formed on the elastic substrate 24. A width $W_1$ of the lead 26 that perpendicularly intersects the extension direction of the lead 26 is smaller than a width $W_2$ of the interconnect 20 that perpendicularly intersects the extension direction of the interconnect 20 (see FIG. 5).

The lead 26 extends to intersect the axis AX (see FIG. 1) that is parallel to the extending direction of the elastic protrusion 18. A pressing force is then applied to the semiconductor device 1 and the elastic substrate 24. This causes the interconnects 20 on the elastic protrusion 18 to come in contact with the leads 26.

Figure 5:
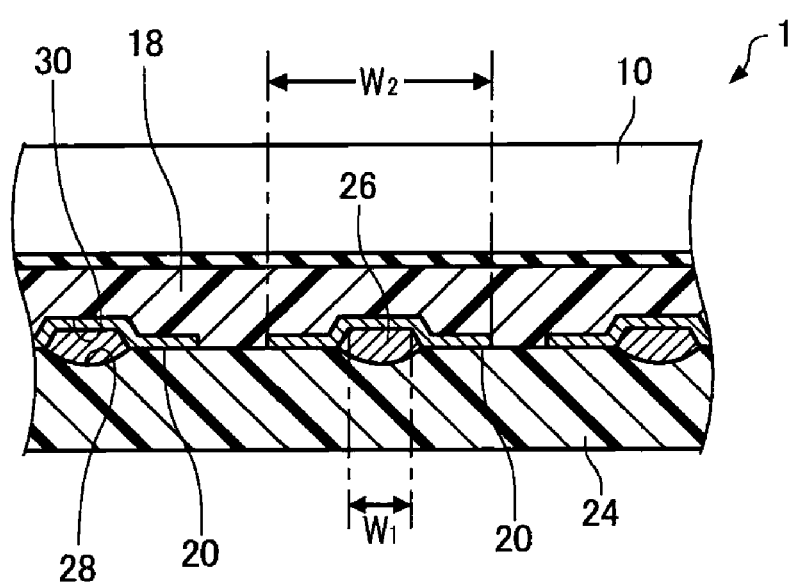
FIG. 5 illustrates a semiconductor module according to one embodiment of the invention.

As shown in FIG. 4, the pressing force causes the elastic substrate 24 to undergo elastic deformation through the lead 26 to form a first depression 28. The lead 26 extends along the surface of the first depression 28. As shown in FIG. 5, the pressing force causes the elastic protrusion 18 to undergo elastic deformation through the interconnect 20 to form a second depression 30. Specifically, both of the elastic substrate 24 and the elastic protrusion 18 undergo elastic deformation. A surface of the elastic protrusion 18 except an area on which the interconnects 20 are provided is then closely in contact with the elastic substrate 24 due to an elastic force (see FIG. 5).

According to this embodiment, since the lead 26 extends on the surface of the first depression 28, the contact area of the lead 26 with the interconnect 20 increases. This improves electrical connection reliability. Since the surface of the elastic protrusion 18 is convexly curved, the lead 26 rarely breaks when causing the lead 26 to extend on the surface of the first depression 28. Moreover, the elastic force of the elastic protrusion 18 disperses stress to prevent breakage of the lead 26.

The adhesive 22 flows between (e.g., is discharged from the space between) the semiconductor device 1 and the elastic substrate 24 due to the pressing force. As shown in FIG. 5, the adhesive 22 is then cured and shrunk by applying heat. The pressing force is maintained until the adhesive 22 is cured. The pressing force is removed when the adhesive 22 has been cured. A semiconductor module is thus produced.

Semiconductor Module

FIG. 5 illustrates a semiconductor module according to one embodiment of the invention. The semiconductor module includes the semiconductor device 1 and the elastic substrate 24 described above. The elastic substrate 24 supports the side of the lead 26 opposite to the elastic protrusion 18. The lead 26 is in contact with part of the interconnect 20 positioned on the elastic protrusion 18.

The elastic substrate 24 has a plurality of first depressions 28 formed by elastic deformation. The inner surface of the first depression 28 is curved corresponding to the surface of the elastic protrusion 18 that has undergone elastic deformation. Each of the leads 26 is in contact with one of the interconnects 20 on a surface of one of the first depressions 28.

The elastic protrusion 18 has a plurality of second depressions 30 formed by elastic deformation (see FIG. 5). Each of the interconnects 20 is in contact with one of the leads 26 on a surface of the second depressions 30. A surface of the elastic protrusion 18 except an area on which the interconnects 20 are provided is in close contact with the elastic substrate 24 due to an elastic force. The elastic protrusion 18 has a modulus of elasticity higher than that of the elastic substrate 24.

The adhesive 22 maintains a space between the surface of the semiconductor chip 10 on which the elastic protrusions 18 are formed and the surface of the elastic substrate 24 on which the leads 26 are formed. The adhesive 22 has been cured and shrunk. The adhesive 22 contains a residual stress due to shrinkage during curing.

According to this embodiment, since the lead 26 comes in contact with the interconnect 20 over the surface of the first depression 28 formed in the elastic substrate 24, the contact area of the lead 26 with the interconnect 20 increases as compared with the case where the lead 26 comes in contact with the interconnect 20 over a flat surface. This improves electrical connection reliability. Since the lead 26 and the interconnect 20 are caused to come in contact due to the elasticity of the elastic substrate 24 and the elastic protrusion 18, electrical connection reliability is further improved. The surface of the lead 26 that faces the first depression 28 is curved. Therefore, since the area of the contact surface of the lead 26 with the elastic substrate 24 increases when the contact surface is curved (see FIG. 5) as compared with when the contact surface is flat, dissipation of heat from the lead 26 to the elastic substrate 24 increases.

Since a surface of the elastic protrusion 18 except an area on which the interconnects 20 are provided is in close contact with the elastic substrate 24 (i.e., only one interface is formed between the elastic protrusion 18 and the elastic substrate 24), the number of moisture entrance paths is reduced. Specifically, since two interfaces are formed when the adhesive 22 is interposed between the elastic protrusion 18 and the elastic substrate 24, the number of moisture entrance paths increases. As a result, ionic migration easily occurs. According to this embodiment, such ionic migration can be prevented. Since the adhesive 22 is not interposed between the elastic protrusion 18 and the elastic substrate 24, a substance that is generally included in the adhesive 22 and is easily ionized (alkali metals such as sodium and potassium (Group 1 elements excluding hydrogen) or halogens such as fluorine, chlorine, and bromine (Group 17 elements)) is absent between the interconnects 20. This also prevents ionic migration. Since the adhesive 22 shrinks upon curing, interfacial separation easily occurs when the cured adhesive 22 is interposed between the elastic protrusion 18 and the elastic substrate 24. According to this embodiment, the adhesive 22 is not interposed between the elastic protrusion 18 and the elastic substrate 24, and the elastic protrusion 18 and the elastic substrate 24 are in close contact with each other due to an elastic force. Therefore, interfacial separation rarely occurs. Examples of an electronic instrument provided with the semiconductor module include a notebook personal computer, a portable telephone, and the like.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A semiconductor module comprising:
a semiconductor chip in which an integrated circuit is formed;
an electrode formed on the semiconductor chip and electrically connected to the integrated circuit;
an insulating film formed on the semiconductor chip and having an opening positioned corresponding to the electrode;
an elastic protrusion disposed on the insulating film, a surface of the elastic protrusion opposite to the insulating film being convexly curved;
an interconnect extending from over the electrode to over the elastic protrusion;
an elastic substrate on which a lead is formed, the lead being in contact with part of the interconnect positioned on the elastic protrusion; and
an adhesive maintaining a space between a surface of the semiconductor chip on which the elastic protrusion is formed and a surface of the elastic substrate on which the lead is formed,
the elastic substrate having a first depression that is formed by elastic deformation; and the lead being in contact with the interconnect on a surface of the first depression.

2. The semiconductor module as defined in claim 1,
the elastic protrusion having a second depression that is formed by elastic deformation; and
the interconnect being in contact with the lead on a surface of the second depression.

3. The semiconductor module as defined in claim 1,
the elastic protrusion having a modulus of elasticity that is higher than a modulus of elasticity of the elastic substrate.

* * * * *